United States Patent [19]

Necoechea

[11] Patent Number: 4,572,971
[45] Date of Patent: Feb. 25, 1986

[54] TRI-STATE DRIVER CIRCUIT FOR AUTOMATIC TEST EQUIPMENT

[75] Inventor: R. Warren Necoechea, Milpitas, Calif.

[73] Assignee: Fairchild Camera and Instrument Corporation, San Jose, Calif.

[21] Appl. No.: 585,477

[22] Filed: Mar. 2, 1984

Related U.S. Application Data

[63] Continuation-in-part of Ser. No. 478,611, Mar. 25, 1983, abandoned.

[51] Int. Cl.[4] .............................................. H03K 5/00
[52] U.S. Cl. .................... 307/260; 307/262; 307/257
[58] Field of Search ...................... 307/52, 75, 80, 125, 307/126, 130, 131, 231, 257, 264, 321, 473, 262, 260; 323/315; 763/67; 358/73; 315/172, 375; 363/132

[56] References Cited

U.S. PATENT DOCUMENTS 3,770,986 11/1973 Orehle ............................. 307/321 X
4,489,371 12/1984 Kernick ............................ 363/132 X Primary Examiner—Harry E. Moose, Jr.
Assistant Examiner—Derek S. Jennings
Attorney, Agent, or Firm—Theodore S. Park; Robert C. Colwell

[57] ABSTRACT

A tri-state driver circuit 10 for selectively driving a node of a device under test by applying and switching between two reference voltages, and for selectively operating at a high impedance output state. Two current sources 16 and 18 provide a bridge current that flows through a diode bridge 20 to establish, at nodes A and B, voltages that equal two reference voltages, DRH and DRL. The diode bridge includes resistors R11 and R16 across which the bridge current is switched to accommodate small voltage swings, and also includes clamp diodes CR3-6 to accommodate large voltage swings. A current switch 22 controls the direction of the bridge current and the selection of which of the two reference voltages appears at node A. A current sink 36, 38, and 40 monitors the average voltage of the diode bridge and adjusts it to equal the average of the two reference voltages. A feedback circuit 42, 44, and 46 monitors the higher of the voltages at nodes A and B and adjusts it to equal the higher of the two reference voltages. A transistor-diode bridge 48 operates as a buffer to generate an output signal equal in voltage to the voltage at node A. A switch controller 50 switches the transistor-diode bridge to a high impedance output state when so selected.

22 Claims, 4 Drawing Figures

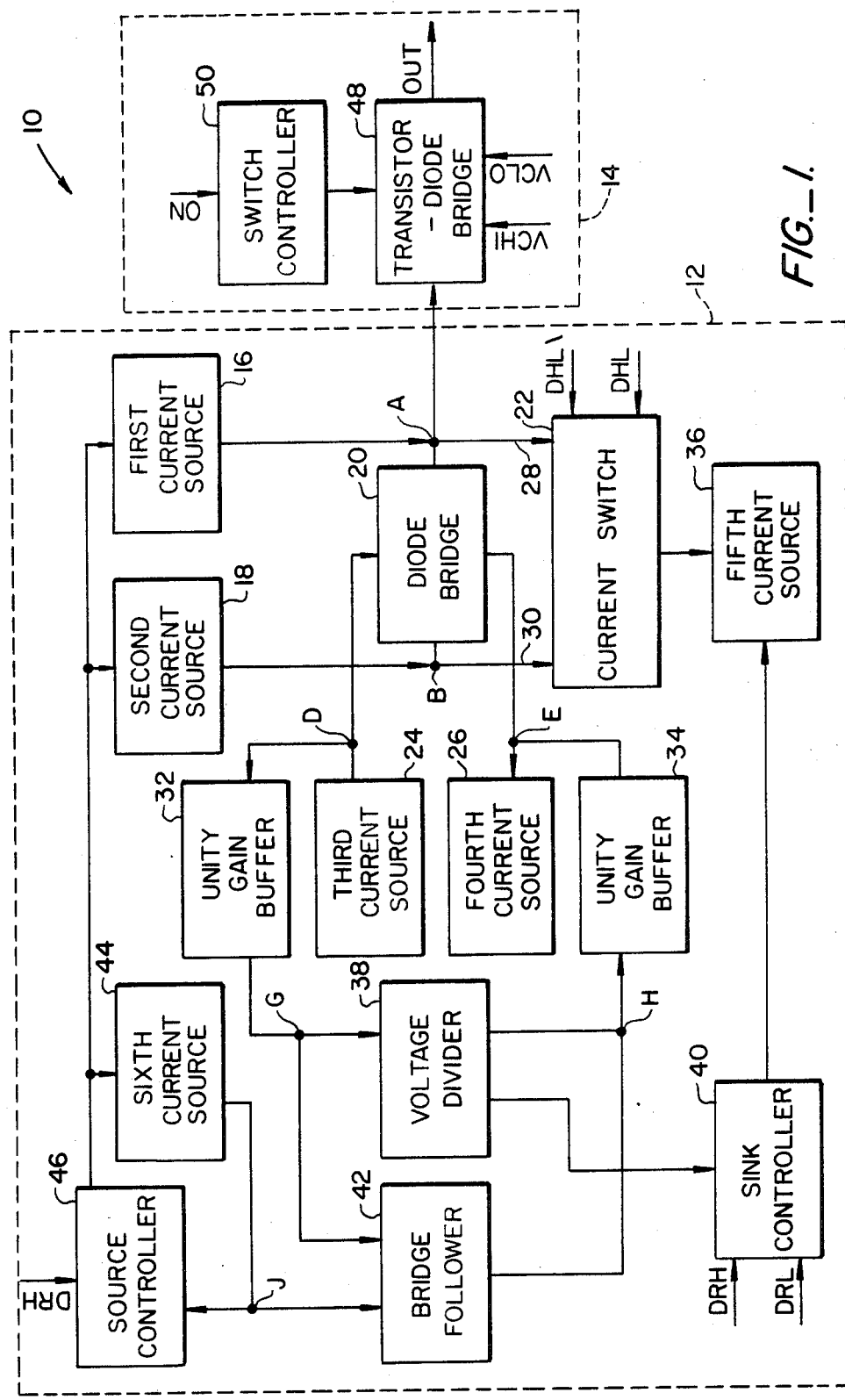
FIG._1.

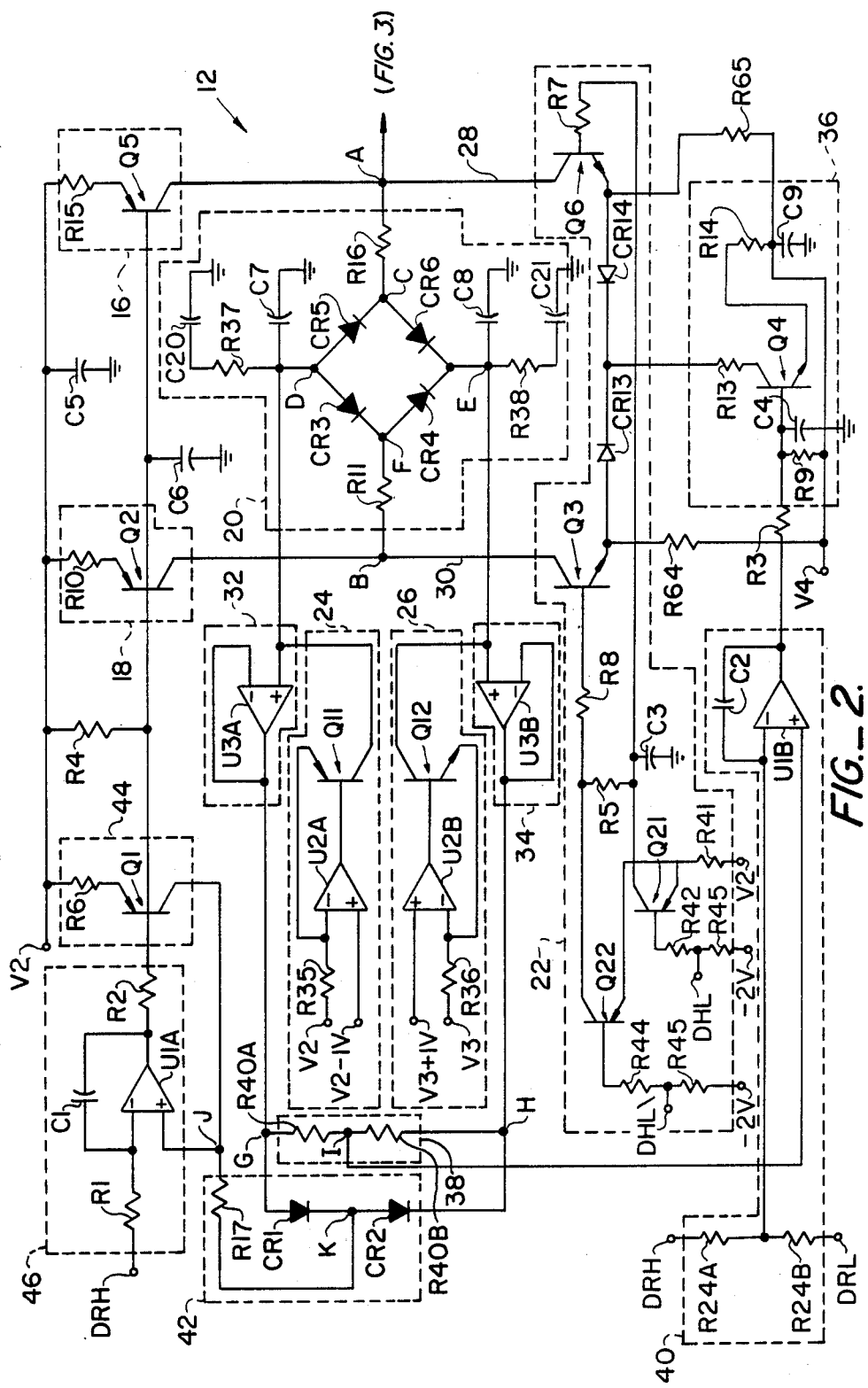
FIG._2.

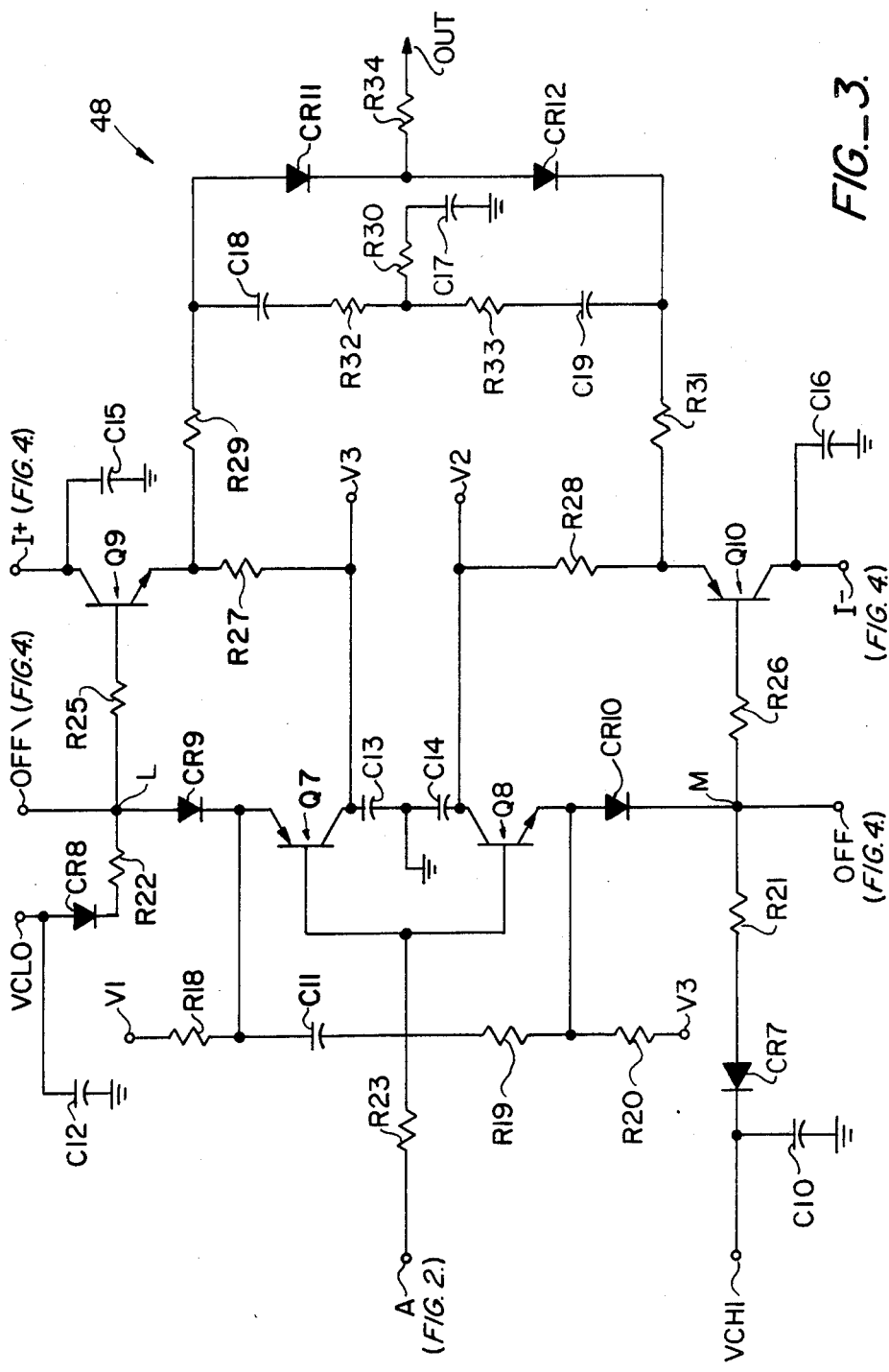
FIG._3.

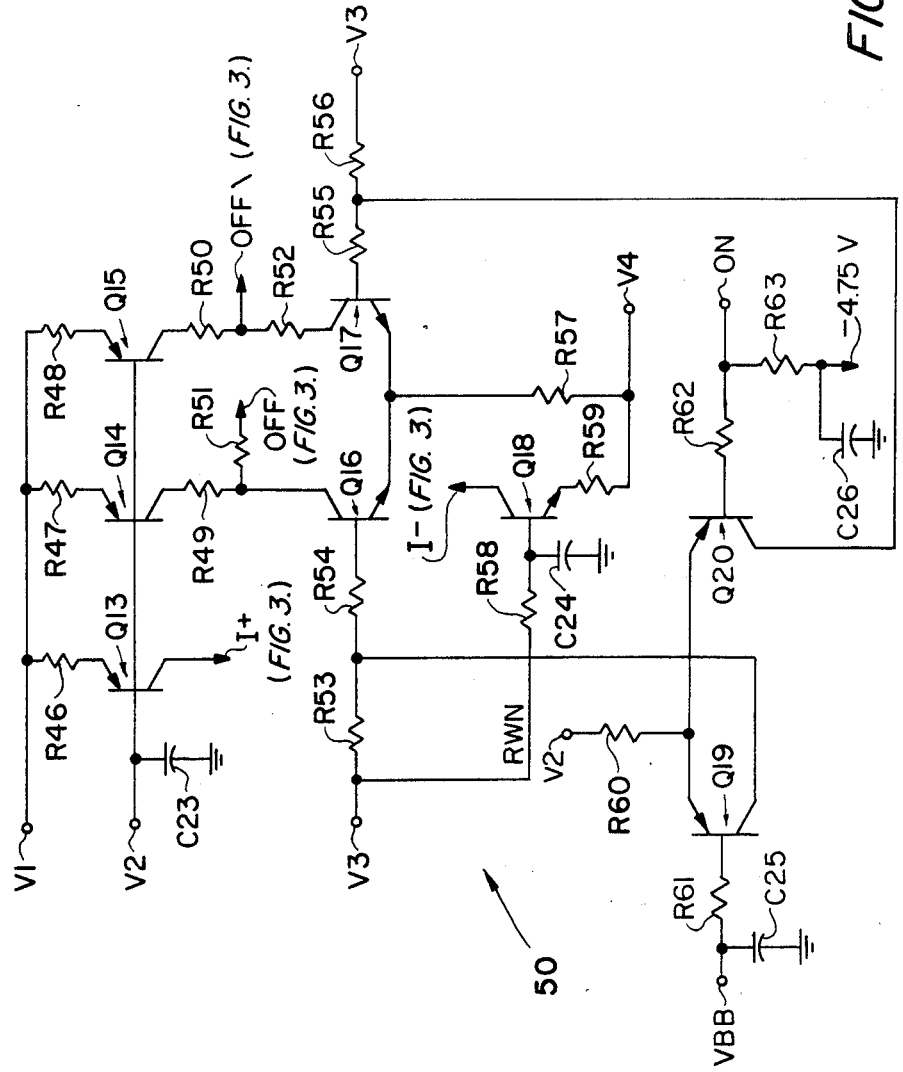
FIG._4.

4,572,971

TRI-STATE DRIVER CIRCUIT FOR AUTOMATIC TEST EQUIPMENT

REFERENCE TO RELATED APPLICATION

This is a continuation-in-part of U.S. patent application Ser. No. 478,611, filed Mar. 25, 1983 and entitled "High Speed Pin Electronics Driver Circuit for Automatic Test Equipment" abandoned.

BACKGROUND OF THE INVENTION

1. Field of the Invention

This invention relates generally to electronic circuits used in automatic test equipment, and relates more particularly to a tri-state driver circuit for selectively driving a node of a device under test by applying and switching between two reference voltages, and for selectively operating at a high impedance output state.

2. Description of the Prior Art

In automatic test equipment used for testing electronic circuits, electronic signals are generated and applied to selected input pins of the device under test. The condition of the output pins of the device under test is then detected and compared with a desired condition to determine the functionality or quality of the circuit. The circuit within the automatic test equipment which drives the pins of the device under test is commonly referred to as the driver circuit.

Because of the wide variety of electronic circuits which must be tested using the same test equipment, it is desirable for the automatic test equipment to be flexible in permitting the high speed switching of a wide range of voltages onto the input pins of the device under test. Accordingly, the driver circuits for such test equipment must generate output signals with a wide range of voltages and rapidly switch these voltages onto the input pins of the device under test. Prior art test equipment typically could supply output signals at small voltage swings of perhaps one or two volts between high and low voltages, or at large voltage swings of perhaps ten volts, but not both. Prior art test equipment has, thus, been unable to rapidly switch driving signals over a range that includes both small and large voltage swings.

SUMMARY OF THE INVENTION

In accordance with the illustrated preferred embodiment, the present invention provides a tri-state driver circuit for selectively driving a node of a device under test by applying and switching between two reference voltages, and for selectively operating at a high impedance output state. The circuit is divided into two portions: a level selector for selection of one of the two reference voltages, and a buffer and tri-state switch for driving an output signal at the voltage selected by the level selector and, alternatively, for switching the circuit to the high impedance state. The circuit of the present invention is particularly adapted for use in automatic test equipment for the testing of electronic circuits in which a wide range of voltages must be switched at high speeds onto the input pins of a device under test.

The level selector portion of the tri-state driver circuit includes several current sources, a diode bridge, a current switch, a current sink, and a feedback circuit. First and second current sources provide a bridge current that flows through the diode bridge to establish, at first and second nodes of the diode bridge, voltages that are equal to the two reference voltages. The diode bridge includes resistors across which the bridge current is switched to accommodate small voltage swings, and also includes clamp diodes to accommodate large voltage swings. Third and fourth current sources respectively supply to and receive from the diode bridge a constant current which limits the maximum value of the bridge current. When the bridge current is less than the constant current, output signals with small voltage swings are generated, and, alternatively, when the bridge current equals the constant current, output signals with large voltage swings are generated.

The current switch is coupled to the diode bridge for controlling the direction of the bridge current according to the selected reference voltage. When the bridge current flows from right to left across the diode bridge, a voltage equal to the higher of the two reference voltages appears at the first node. Conversely, when the bridge current flows from left to right, a voltage equal to the lower of the two reference voltages appears at the first node. Currents from the first and second current sources flow through the diode bridge and the current switch to the current sink, which monitors the average voltage of the diode bridge and adjusts it to equal the average of the two reference voltages. The feedback circuit monitors the higher voltage at the two nodes of the diode bridge and adjusts it to equal the higher of the two reference voltages by controlling the currents supplied by the first and second current sources.

The buffer and tri-state switch portion of the tri-state driver circuit includes a switch controller and an active transistor-diode bridge. When the switch controller supplies a current to one node of the transistor-diode bridge and receives an equal current from another node, the transistor-diode bridge operates as a unity gain buffer. As a buffer, four diodes of the transistor-diode bridge are forward-biased and conductive, and four emitter follower transistors generate an output signal that is equal in voltage to that of the first node of the level selector. When the high impedance output state is selected, the switch controller reverses the directions of the currents applied to the nodes of the transistor-diode bridge. This current reversal acts to reverse-bias the diodes of the transistor-diode bridge, which causes the output of the tri-state driver circuit to be at the high impedance state.

BRIEF DESCRIPTION OF THE DRAWINGS

FIG. 1 is a block diagram of the tri-state driver circuit according to the preferred embodiment of the present invention.

FIG. 2 is a schematic diagram of a level selector portion of the tri-state driver circuit of FIG. 1.

FIG. 3 is a schematic diagram of a transistor-diode bridge utilized in the tri-state driver circuit of FIG. 1.

FIG. 4 is a schematic diagram of a switch controller that is coupled to the transistor-diode bridge of FIG. 3.

DETAILED DESCRIPTION OF THE PREFERRED EMBODIMENT

The preferred embodiment of the present invention is a tri-state driver circuit for generating an output signal for driving a device under test. The output signal alternates between two predetermined reference voltages. In addition, the tri-state driver circuit is capable of switching to a high impedance output state. FIG. 1 illustrates the entire tri-state driver circuit in functional block form, while FIGS. 2, 3, and 4 illustrate various portions of the circuit in schematic form. The circuits illustrated in FIGS. 2, 3, and 4 are coupled together in the manner indicated by notations on the Figures to form the complete tri-state driver circuit of the present invention. The circuit of FIG. 2 is a level selector circuit that switches one of two reference voltages, DRH and DRL, onto node A. The circuit of FIG. 3 is a unity gain buffer and tri-state switch which accepts the signal at node A and supplies an equal voltage output signal at node OUT. The circuit of FIG. 3 is also capable of switching node OUT to a high impedance state. The circuit of FIG. 4 provides various functions for the circuits of FIGS. 2 and 3, including selection of the high impedance output state. A description of the overall circuit operation will be provided below first in reference to FIG. 1, followed by detailed descriptions of the circuits of FIGS. 2, 3, and 4.

In reference to FIG. 1, a tri-state driver circuit according to the preferred embodiment of the present invention is shown generally at 10. The several functional blocks to the left of node A comprise a level selector circuit 12, while the remaining functional blocks comprise a buffer and tri-state switch 14. The level selector circuit 12 selects one of the two reference voltages, DRH and DRL, and generates a voltage at node A equal to the selected reference voltage. Inputs DHL and DHL control the selection process. Input ON determines whether the buffer and tri-state switch supplies an output voltage equal to the selected reference voltage at OUT, or switches to a high impedance output state at OUT. Inputs VCHI and VCLO are clamp voltages that define the allowable output range of the buffer when the high impedance output state is selected.

The level selector circuit 12 establishes, at first node A and at second node B, voltages that equal the two reference voltages, DRH and DRL. First and second current sources 16 and 18 respectively supply first and second currents to nodes A and B. The first and second currents are substantially equal. A diode bridge 20 and a current switch 22 are connected in parallel across nodes A and B. A portion of the first or second current, equal to a bridge current, flows through the diode bridge. The direction of flow of the bridge current is selected by the current switch in response to inputs DHL and DHL . Third and fourth current sources 24 and 26 respectively supply to and receive from the diode bridge a constant current which limits the maximum value of the bridge current.

The direction of flow of the bridge current through the diode bridge 20 determines which of the two reference voltages is established at node A. When the bridge current flows from node A to node B across the diode bridge, the voltage at node A is equal to DRH and the voltage at node B is equal to DRL. Conversely, when the bridge current flows from node B to node A across the diode bridge, the voltage at node A is equal to DRL and the voltage at node B is equal to DRH. The current switch 22 controls the direction of the bridge current by controlling the amount of current flowing through lines 28 and 30.

The voltages at nodes A and B are determined by a current sink circuit and by a feedback circuit. Both the current sink circuit and the feedback circuit monitor the voltages at nodes D and E. To prevent loading of the diode bridge circuit, two unity gain buffers 32 and 34 are respectively coupled to nodes D and E and respectively supply equivalent voltages at nodes G and H. The current sink circuit includes a fifth current source 36 coupled to current switch 22, a voltage divider 38 connected between nodes G and H, and a sink controller 40 that is coupled to both the fifth current source and the voltage divider. The fifth current source 36 acts as an adjustable current drain for the first and second currents that pass through the current switch. Voltage divider 38 forms a voltage that is equal to the average voltage at nodes D and E of the diode bridge. Sink controller 40 compares that average voltage to the average of DRH and DRL, and controls the current flowing through the fifth current source to cause the two average voltages to be equal.

The feedback circuit monitors the higher of the voltages at nodes A and B and adjusts the first and second currents so that the higher voltage at node A or B equals the higher of the two reference voltages. The feedback circuit includes a bridge follower 42 that is connected between nodes G and H, a sixth current source 44 that drives the bridge follower, and a source controller 46 that is coupled to the first, second, and sixth current sources. Since the current of the sixth current source 44 is substantially equal to the first and second currents of the first and second current sources, and since the bridge follower 42 acts like the diode bridge, a voltage is established at node J that equals the higher of the two voltages at nodes A and B. Source controller 46 adjusts the first and second currents such that the voltage at node J is equal to DRH.

The buffer and tri-state switch 14 is either on or off, depending upon whether an output or a high impedance output state is desired. When switch 14 is on, it operates as a buffer to supply an output voltage at node OUT equal to the voltage at node A. When switch 14 is off, it isolates the tri-state driver circuit from the device under test by switching to the high impedance state. Included within the buffer and tri-state switch is a transistor-diode bridge 48 and a switch controller 50. Transistor-diode bridge 48 serves as a unity gain buffer to drive node OUT at the same voltage as node A when switch 14 is on. Bridge 48 also serves to establish a high impedance output state at node OUT when switch 14 is off. The switch controller 50 supplies currents to bridge 48 according to the state of switch 14.

Turning now to FIG. 2, the level selector circuit 12 is shown in greater detail. The components and interconnections therebetween that form the level selector circuit will be described first. Then, the operation of the level selector circuit will be described.

The first current source 16 includes a PNP transistor Q5 and resistor R15. One end of resistor R15 is connected to the emitter of transistor Q5, and the other end of resistor R15 is connected to V2, which is a source of positive voltage. The collector of transistor Q5 is connected to node A for supplying the first current to the diode bridge 20.

The second current source 18 includes a PNP transistor Q2 and resistor R10. One end of resistor R10 is connected to the emitter of transistor Q2, and the other end of resistor R10 is connected to V2. The collector of transistor Q2 is connected to node B for supplying the second current to the diode bridge 20. The base of transistor Q2 is connected to the base of transistor Q5. Transistors Q2 and Q5 and resistors R10 and R15 are matched components so that the first and second currents are equal.

The sixth current source 44 also includes a PNP transistor and resistor coupled to V2. One end of resistor R6 is connected to the emitter of transistor Q1, and the other end of resistor R6 is connected to V2. The collector of transistor Q1 is connected to node J for supplying a feedback current. The base of transistor Q1 is connected to the bases of transistors Q2 and Q5 and is also connected to one end of resistor R2 of source controller 46. Resistor R4 is connected between V2 and the common connection among the bases of transistors Q1, Q2, and Q5. Capacitor C5 is connected between ground and V2, while capacitor C6 is connected between ground and the common connection among the bases of transistors Q1, Q2, and Q5.

The diode bridge 20 comprises four diodes CR3, CR4, CR5, and CR6 and two resistors R11 and R16 disposed between nodes A (first), B (second), C (third), D (fourth), E (fifth), and F (sixth). (Numbers in parentheses relate to the description of the nodes in the claims below). One end of resistor R16 is connected to node A and the other end is connected to node C. One end of resistor R11 is connected to node B and the other end is connected to node F. The anode of diode CR3 is connected to node D and the cathode thereof is connected to node F. The anode of diode CR4 is connected to node F and the cathode thereof is connected to node E. The anode of diode CR5 is connected to node D and the cathode thereof is connected to node C. The anode of diode CR6 is connected to node C and the cathode thereof is connected to node E.

The diode bridge also comprises bypass capacitors and RC filters coupled to nodes D and E. Capacitors C7 and C8 are respectively connected between ground and nodes D and E. Resistor R37 is connected at one end to node D and at the other end to ground through capacitor C20. Resistor R38 is connected at one end to node E and at the other end to ground through capacitor C21.

Third current source 24 supplies a constant current into node D. It comprises a PNP transistor, Q11, having a collector connected to node D, an emitter connected to the inverting input (−) of an operational amplifier U2A, and a base connected to the output of operational amplifier U2A. Resistor R35 is connected between the inverting input of U2A and positive voltage V2, while the non-inverting input (+) of U2A is connected to a voltage equal to V2 minus one volt. Due to the virtual short that exists between the two inputs of U2A, the voltage drop across resistor R35 is equal to one volt. Due to the high input impedance of U2A, substantially all of the current from V2 flows through transistor Q11 and to node D. The third current source thus provides a constant current to node D. In the preferred embodiment of the present invention, the constant current may equal, for example, ten milliamperes.

The fourth current source 26 operates in a fashion similar to the third current source and receives the same constant current from node E. It comprises an NPN transistor, Q12, having a collector connected to node E, an emitter connected to the inverting input (−) of an operational amplifier U2B, and a base connected to the output of U2B. Resistor R36 is connected between the inverting input of U2B and a constant negative voltage V3, while the non-inverting input (+) of U2B is connected to a voltage equal to V3 plus one volt. Since the resistance of resistors R35 and R36 are equal, and since the voltage drop across resistors R35 and R36 are equal, the current flowing into node D from the third current source is equal to the current flowing out of node E to the fourth current source.

The unity gain buffers 32 and 34 respectively drive nodes G (seventh) and H (eighth) at voltages respectively equal to nodes D and E. Buffer 32 is an operational amplifier U3A having a non-inverting input (+) connected to node D and an inverting input (−) commonly connected to both the output of U3A and node G. Buffer 34 is an operational amplifier U3B having a non-inverting input (+) connected to node E and an inverting input (−) commonly connected to both the output of U3B and node H.

Current switch 22 provides a path for the first and second currents to flow to the fifth current source 36, as well as the means for controlling the direction of flow of the bridge current. Transistor Q6 controls the direction of flow of the first current from the first current source 16. Transistors Q6 is an NPN transistor having a collector connected to node A and having an emitter that is coupled to the fifth current source through a diode CR14. The emitter of transistor Q6 is also connected to a source of negative voltage V4 through resistor R65. Transistor Q3 controls the direction of flow of the second current from the second current source 18. Transistor Q3 is an NPN transistor having a collector connected to node B and having an emitter that is coupled to the fifth current source through a diode CR13. The emitter of transistor Q3 is also connected to V4 through resistor R64. The cathodes of both diodes CR13 and CR14 are connected in common to one end of resistor R13 of the fifth current source.

Transistors Q21 and Q22 provide switching control for transistors Q6 and Q3. Transistor Q21 is a PNP transistor having a collector that is connected to the base of transistor Q6 through resistor R7. The base of transistor Q21 is connected to one end of a resistor network that includes resistor R42 connected between the base of Q21 and input DHL, and resistor R43 connected between input DHL and a voltage source at negative two volts. The emitters of transistors Q21 and Q22 are commonly connected to one end of resistor R41, which is connected at the other end thereof to positive voltage source V2. Transistor Q22 is also a PNP transistor and has a collector connected to the base of transistor Q3 through resistor R8. Resistor R5 is connected between the collectors of transistors Q21 and Q22, while the collector of Q21 is coupled to ground through capacitor C3. The base of transistor Q22 is connected to one end of another resistor network that includes resistor R44 connected between the base of Q22 and input DHL , and resistor R45 connected between input DHL and a voltage source at negative two volts.

Voltage divider 38 provides a voltage at node I (ninth) that equals the average of the voltages at nodes G and H. The voltage divider includes two matched resistors R40A and R40B, with resistor R40A connected between node G and node I and resistor R40B connected between node H and node I. Resistors R40A and R40B are matched in that the resistance values for each resistor are equal.

Sink controller 40 uses the voltage at node I as well as the two reference voltages, DRH and DRL, to control the fifth current source 36. The sink controller includes an operational amplifier U1B having a non-inverting input (+) connected to node I of the voltage divider. The inverting input (−) of U1B is coupled to the output of U1B through capacitor C2 and is connected to the center of a voltage divider formed by resistors R24A and R24B. Resistors R24A and R24B are matched resistors having the same resistance values. Resistor R24A is connected between the inverting input of U1B and DRH, while resistor R24B is connected between the inverting input of U1B and DRL. Thus, a voltage equal to the average of the two reference voltages is input to the inverting input of U1B. The output of U1B is coupled to the fifth current source through resistor R3.

The fifth current source 36 receives the bulk of the current flowing through transistors Q3 and Q6 of the current switch 22. The fifth current source includes an NPN transistor with the collector thereof connected through resistor R13 to the common cathode connection of diodes CR13 and CR14. The emitter of transistor Q4 is coupled to V4 through resistor R14 and to ground through resistor R14 and capacitor C9. The base of transistor Q4 is driven by the output of operational amplifier U1B through resistor R3. Resistor R9 is connected between the base of transistor Q4 and voltage V4, while capacitor C4 is connected between the base of Q4 and ground.

The bridge follower 42 acts like the diode bridge and allows the feedback circuit to monitor the voltages on the diode bridge without interfering with its operation. The bridge follower includes two diodes, CR1 and CR2, that are matched to diodes CR3, CR4, CR5, and CR6 of the diode bridge, and a resistor, R17, that is matched to resistor R16 of the diode bridge. Diode CR1 has an anode connected to node G and a cathode connected to node K (eleventh), while diode CR2 has an anode connected to node K and a cathode connected to node H. Resistor R17 is connected between node K and node J (tenth).

The source controller 46 adjusts the flow of current through transistors Q1, Q2, and Q5 until the voltage at node J equals the higher of the two reference voltages. Source controller 46 includes an operational amplifier U1A having a non-inverting input (+) connected to node J, and an output connected to the bases of transistors Q1, Q2, and Q5 through resistor R2. The inverting input (−) of U1A is coupled to the output thereof through capacitor C1, and is coupled to DRH through resistor R1. This completes the physical description of the level selector circuit 12.

The operation of the level selector circuit 12 will be described first in relation to small voltage swings, and later in relation to large voltage swings. The difference in circuit operation between small and large voltage swings is in the operation of the diode bridge 20, otherwise the level selector circuit operates the same regardless of the size of the voltage swings.

The current switch 22 controls the direction of the bridge current, and, therefore, controls the selection of whether the higher (DRH) or the lower (DRL) reference voltage is to be found at node A. Inputs DHL and DHL are ECL level inputs and control the current switch. To select DRH, DHL is set at a logic high level and DHL is set at a logic low level. When DHL is logic high and DHL is logic low, transistor Q22 is on and transistor Q21 is off. This causes transistor Q3 to be on and Q6 to be nearly off. Transistor Q6 is not turned completely off due to the presence of a small current flowing through its emitter and resistor R65. This small current keeps transistor Q6 partially on so as to allow it to more rapidly switch fully on at the desired time. With transistor Q3 on, the collector of Q3 receives a current from node B that equals the bridge current plus the second current from the second current source 18. This current is then passed through diode CR13 to transistor Q4 and then to negative voltage source V4.

When transistor Q6 is nearly off, most of the first current supplied by the first current source 16 is forced to flow through resistor R16 and into the diode bridge. The portion of the first current that flows through resistor R16 and into the diode bridge equals the bridge current. If the bridge current is less than the constant current flowing through the diode bridge into node D and out of node E, then all of the diodes are forward biased. Any current that flows into node C causes a like current to flow out of node F, because the currents into node D and out of node E are equal and fixed by the third and fourth current sources 24 and 26 and because the diode bridge can not store any current. Therefore, the bridge current that flows through resistor R16 also flows through resistor R11.

All of the diodes of the diode bridge are forward biased when the difference between DRH and DRL is a small voltage swing. The boundary between small and large voltage swings occurs when the difference between DRH and DRL equals the total voltage drop across resistors R11 and R16 at a bridge current equal to the constant current. Thus, at small voltage swings, the bridge current is less than the constant current.

When the level selector is operating at small voltage swings, the voltages at nodes C and F are approximately equal since they are both equal to the voltage at node D minus a diode drop. The voltage at node E is equal to the voltage at node C or node F minus a diode drop. For smaller and smaller swings, the voltages at nodes C and F become more equal until, at zero swing, the voltages are equal. Therefore, the average of the voltages at nodes C and F is equal to the average of the voltages at nodes D and E.

The average of the voltages at nodes C and F and the average of the voltages at nodes D and E are also equal to the average of the voltages at nodes A and B. The voltage at node A is equal to the voltage at node C plus the voltage drop across resistor R16. In addition, the voltage at node B is equal to the voltage at node F minus the voltage drop across resistor R11. Since the current through R16 equals the current through R11, and the resistance of R16 equals the resistance of R11, the voltage drop across R11 equals the voltage drop across R16. Therefore, the average of the voltages at nodes C and F is equal to the average of the voltages at nodes A and B.

When DRH is selected, the feedback circuit ensures that the voltage at node J equals DRH. The unity gain buffers 32 and 34 respectively hold the voltages at nodes G and H to be equal to the voltages at nodes D and E. In the preferred embodiment, the resistance value of resistor R15 is trimmed so that the voltage drop between nodes A and E equals the voltage drop between nodes J and H, which means, in effect, that transistor Q1 outputs a feedback current through node J that equals the bridge current supplied by transistor Q5 to the diode bridge. Since buffer 34 keeps the voltage at node H equal to the voltage at node E, the voltage at node J equals the voltage at node A. Operational amplifier U1A compares the voltage at node J with DRH and drives transistor Q1 and Q5 to adjust the currents therefrom until the voltage at J equals DRH. Since the voltage at node A equals the voltage at node J, the voltage at node A is equal to DRH.

Meanwhile, the current sink circuit ensures that the average voltage of the diode bridge is equal to the average of the two reference voltages. The voltage at node I in the voltage divider 38 is equal to the average of the voltages at nodes G and H. Buffers 32 and 34 respectively hold the voltages at nodes G and H to be equal to the voltages at respective nodes D and E. Therefore, the voltage at node I equals the average voltage at nodes D and E, and, at small swings with the diode bridge fully conductive, the voltage at node I also equals the average of the voltages at nodes C and F. The voltage at node I is compared to the average of DRH and DRL by operational amplifier U1B. Operational amplifier U1B drives transistor Q4 to adjust the current flowing out of the current sink 36 until the voltage at I and the average of DRH and DRL are equal. Thus, the average of the voltages at nodes C and F is equal to the average of DRH and DRL. Combining this with the knowledge that the average of the voltages at nodes C and F equals the average of the voltages at nodes A and B and that the voltage at node A equals DRH, one concludes that the voltage at node B is equal to DRL.

When DRL is selected for output, the reverse situation results with the voltage at node B equal to DRH and the voltage at node A equal to DRL. When DRL is selected, DHL is logic low and DHL is logic high, causing transistor Q21 to turn on and transistor Q22 to turn off. This in turn turns transistor Q6 on and transistor Q3 to be nearly off. Transistor Q3 stays partially on due to a slight current through resistor R64, for the same reasons that Q6 stays partially on when DRH is selected. With transistor Q6 on when DRL is selected, the entire amount of the first current from transistor Q5 flows through the collector of Q6. In addition, most of the second current from transistor Q2 flows through resistor R11 and into the diode bridge, causing a like amount of current to flow from node C, through resistor R16, out node A and into the collector of transistor Q6.

In this case, however, the feedback circuit maintains the voltage at node B to be equal to DRH. In the preferred embodiment, the value of resistor R10 is trimmed so that the voltage drop between node B and node E, when DRL is selected, is equal to the voltage drop between node J and node H. Since the voltage at node H equals the voltage at node E, the voltage at node B equals the voltage at node J. In a fashion as described above, the feedback circuit adjusts the currents through transistors Q1 and Q2 until the voltage at B equals DRH.

The current sink operates as described above to hold the average voltage of the diode bridge to be equal to the average of DRH and DRL. Since the average of the voltages at nodes C and F equals the average of DRH and DRL, and the voltage at node B is equal to DRH, then the voltage at node A is equal to DRL. The average of the voltages at nodes C and F do not change when DRL is selected; it remains equal to the average of DRH and DRL. In addition, the voltages at nodes D and E do not change when DHL is selected; they remain constant at voltages respectively a diode drop above and a diode drop below the average of DRH and DRL. In switching from DRH to DRL, the magnitude of the bridge current does not change, just the direction. Consequently, the level selector switches from one output voltage to the other simply by changing the direction of the flow of the bridge current. In other words, the level selector switches a current (the bridge current) across a resistor (R11+R16) to obtain small voltage swings.

When large voltage swings are required, the diode bridge limits the current that is switched through resistors R11 and R16 and provides clamp voltages. The maximum amount of bridge current is equal to the constant current that the third and fourth current sources respectively supplies to and receives from the diode bridge. The amount of current flowing out of the diode bridge through node E comes to node E through diode CR4 and diode CR6. Assuming that DRH is selected, all of the bridge current that flows through resistor R16 flows to node E through diode CR6. If, for example, the constant current is equal to ten milliamperes and the bridge current is also equal to ten milliamperes, then all of the current that flows from node E comes through diode CR6 and none comes through diode CR4. In addition, all of the ten milliamperes supplied to node D by transistor Q11 flows through diode CR3 to node F and then through resistor R11 to node B. Since no current flows through diodes CR4 and CR5, they are reversed biased and permit the voltages at nodes A, C, and E to be independent of the voltages at nodes B, D, and F.

A similar result is obtained when DRL is selected. In such case, a bridge current equal to the constant current flows into node B from transistor Q2, then through resistor R11 to node F, and then through diode CR4 to node E. Also, the current from transistor Q11 flows into node D, then through diode CR5 to node C, and then through resistor R16 to node A. In this case, diodes CR3 and CR6 are reverse biased and the voltages at nodes B, E, and F are independent of the voltages at nodes A, C, and D. Thus, when the level selector circuit operates at large voltage swings, the voltage at node D is independent of the voltage at node E, and the voltage at node A relates to either the voltage at node D or the voltage at node E, depending upon the direction of flow of the bridge current.

The voltage that is established at node E is a clamp voltage for DRH. As described above, buffer 34 holds the voltage at node H to be equal to the voltage at node E. Also as described above, the voltage drop from node A to node E, when DRH is selected, is equal to the voltage drop from node J to node H. Operational amplifier U1A of the source controller adjusts the currents supplied by transistors Q1 and Q5 so that the voltage at node J equals DRH, and, therefore, the voltage at node A equals DRH. When DRL is selected, the voltage drop from node B to node E is equal to the voltage drop from node J to node H, and operational amplifier U1A adjusts the currents supplied by transistors Q1 and Q2 so that the voltage at node B equals DRH. When the level selector operates at large voltage swings, the bridge current is always equal to the constant current. Since the resistance of resistor R11 equals the resistance of resistor R16, and since the voltage drop across diode CR4 equals the voltage drop across diode CR6, the voltage at E is constant and equal to DRH minus a diode drop and minus the voltage drop across R16. The constant voltage at node E is thus a clamp voltage for DRH.

Correspondingly, the voltage that is established at node D is a clamp voltage for DRL. As described above, the current sink circuit maintains the voltage at node I to be equal to the average of DRH and DRL. Since buffers 32 and 34 respectively maintain the voltages at nodes G and H to be equal to the voltages at nodes D and E, and since the voltage at I is equal to the average between the voltages at nodes G and H, the average between the voltages at nodes D and E is equal to the average of DRH and DRL. This relation is shown in equation (1):

$$\tfrac{1}{2} \times (VD+VE) = \tfrac{1}{2} \times (DRH+DRL) \quad (1)$$

where VD is the voltage at node D and VE is the voltage at node E. These terms can be rearranged to form equation (2):

$$VD = DRH + DRL - VE \quad (2)$$

Directly above, it was shown that:

$$VE = DRH - DD - VR16 \quad (3)$$

where DD is the diode drop across CR4 or CR6 and VR16 is the voltage drop across resistor R16 or resistor R11. Combining equations (2) and (3) forms equation (4):

$$VD = DRL + DD + VR16 \quad (4)$$

When DRL is selected, current flows through diode CR5 and resistor R16, and the voltage at node A (VA) is given by equation (5):

$$VA = VD - DD - VR16 \quad (5)$$

Substituting equation (4) into equation (5) yields equation (6):

$$VA = DRL \quad (6)$$

When DRL is selected, therefore, the voltage at node A is equal to DRL. The voltage at node D thus acts as a clamp voltage for DRL.

In summary, the level selector circuit 12 supplies a voltage at node A that equals either DRH or DRL, according to the inputs DHL and DHL . At small voltage swings, the diode bridge is fully conductive, and the bridge current across resistors R11 and R16 establishes voltages equal to DRH and DRL at nodes A and B. At large voltage swings, the bridge current equals the constant current, two of the four diodes of the diode bridge conduct at any one time, and the feedback and current sink circuits establish clamp voltages at nodes D and E. This, in turn, establishes voltages equal to DRH and DRL at nodes A and B. At both small and large voltage swings, the current switch controls the direction of the bridge current to select which of DRH and DRL appears at node A.

Turning now to FIGS. 3 and 4, the circuitry and operation of the buffer and tri-state switch 14 will be described. The transistor-diode bridge 48 of FIG. 3 is a unity gain buffer that generates an output signal at node OUT that is equal in voltage to the voltage at node A. Bridge 48 also operates as a high impedance switch to selectively isolate the tri-state driver circuit 10 from the device under test.

Four transistor Q7, Q8, Q9, and Q10 and four diodes CR9, CR10, CR11, and CR12 form the basic transistor-diode bridge. Each of the transistors of the transistor-diode bridge is wired in an emitter follower configuration. Transistors Q7 and Q8 are the input transistors of the transistor-diode bridge, and have bases that are commonly connected to node A through resistor R23. Transistor Q7 is a PNP transistor having the collector thereof connected to a source of negative voltage, V3, and also coupled to ground through capacitor C13. The emitter of transistor Q7 is connected to the cathode of diode CR9, and is also connected through resistor R18 to a source of positive voltage, V1. Transistor Q8 is an NPN transistor having the collector thereof connected to a source of positive voltage, V2, and also coupled to ground through capacitor C14. The emitter of transistor Q8 is connected to the anode of diode CR10, and is also connected through resistor R20 to V3. The emitters of transistors Q7 and Q8 are coupled together through capacitor C11 and resistor R19.

The anode of diode CR9 is connected to the base of transistor Q9 through node L (twelfth) and resistor R25. Resistor R22 is connected between node L and the cathode of diode CR8. The anode of diode CR8 is coupled to ground through capacitor C12 and is connected to an input, VCLO, that acts as a low clamping voltage. The operation of diode CR8 and input VCLO will be explained below. Node L is also coupled to the switch controller circuit 50 through node OFF .

The cathode of diode CR10 is connected to the base of transistor Q10 through node M (thirteenth) and resistor R26. Resistor R21 is connected between node M and the anode of diode CR7. The cathode of diode CR7 is coupled to ground through capacitor C10 and is connected to an input, VCHI, that acts as a high clamping voltage. Node M is also coupled to the switch controller through node OFF. Diodes CR9 and CR10 are the input diodes of the transistor-diode bridge.

Transistor Q9 is an NPN transistor having the emitter thereof connected to the anode of diode CR11 through resistor R29. The emitter of transistor Q9 is also connected to V3 through resistor R27. The collector of transistor Q9 is connected to the switch controller through node I+ and is coupled to ground through capacitor C15.

Transistor Q10 is a PNP transistor having the emitter thereof connected to the cathode of diode CR12 through resistor R31. The emitter of transistor Q10 is also connected to V2 through resistor R28. The collector of transistor Q10 is connected to the switch controller through node I− and is coupled to ground through capacitor C16. Transistors Q9 and Q10 are the output transistors of the transistor-diode bridge.

Diodes CR11 and CR12 are the output diodes of the transistor-diode bridge. The cathode of diode CR11 is commonly connected to the anode of diode CR12, and is connected to node OUT through resistor R34. The anode of diode CR11 and the cathode of diode CR12 are coupled together through a resistor-capacitor network that includes capacitor C18, resistor R32, resistor R33, and capacitor C19, all connected in series. The connection between resistors R32 and R33 is coupled to ground through resistor R30 and capacitor C17.

The circuitry of the switch controller 50 is illustrated in FIG. 4. Transistors Q19 and Q20 provide a first differential amplifier that operates according to inputs VBB and ON to drive a second differential amplifier composed of transistors Q16 and Q17. Transistors Q19 and Q20 are both PNP transistors with the emitters thereof commonly connected through resistor R60 to a source of positive voltage, V2. The base of transistor Q19 is connected to input VBB through resistor R61 and is coupled to ground through R61 and capacitor C25. The base of transistor Q20 is connected to input ON through resistor R62. The common connection between input ON and resistor R62 is coupled through resistor R63 to a source of negative 4.75 volts and through R63 and capacitor C26 to ground.

Transistor Q16 and Q17 are NPN transistors that form the second differential amplifier within the switch controller 50. The base of transistor Q16 is connected to the collector of transistor Q19 through resistor R54. The end of resistor R54 opposite the base of transistor Q16 is also connected to a source of negative voltage, V3, through resistor R53. When transistor Q19 is off, a bias voltage is applied to the base of transistor Q16 through resistors R54 and R53. The collector of transistor Q16 is connected to node OFF through resistor R51. The base of transistor Q17 is connected to the collector of transistor Q20 through resistor R55. The end of resistor R55 opposite the base of transistor Q17 is also connected to V3 through resistor R56. When transistor Q20 is off, a bias voltage is applied to the base of transistor Q17 through resistors R55 and R56. The collector of transistor Q17 is connected to node OFF through resistor R52. The emitters of transistors Q16 and Q17 are commonly connected to a source of negative voltage, V4, through resistor R57.

Transistor Q18 provides a negative current to node I− of the transistor-diode bridge. Transistor Q18 is an NPN transistor having a collector thereof connected to node I−. The base of transistor Q18 is connected to the collector of transitor Q19 through resistor R58 and is coupled to ground through capacitor C24. The emitter of transistor Q18 is connected to V4 through resistor R59.

Transistors Q13, Q14, and Q15 are constant current sources that are used to respectively drive nodes I+, OFF, and OFF . Transistor Q13 is a PNP transistor having an emitter connected to V1 through resistor R46 and having a collector connected to node I+. Transistor Q14 is a PNP transistor having an emitter connected to V1 through resistor R47 and having a collector connected to the collector of transistor Q16 through resistor R49. The collector of transistor Q14 is connected to node OFF through resistors R49 and R51. Transistor Q15 is a PNP transistor having an emitter connected to V1 through resistor R48 and having a collector connected to node OFF through resistor R50. The bases of transistors Q13, Q14, and Q15 are commonly connected to V2 and are also coupled to ground through capacitor C23.

Having thus described the circuitry of the buffer and tri-state switch 14, the operation thereof will now be explained. When the tri-state driver circuit 10 is to operate as a driver circuit, input ON is higher in voltage than input VBB. When input ON is higher than input VBB, transistor Q19 is turned on and transistor Q20 is turned off. This in turn turns transistor Q16 on and transistor Q17 off. When transistor Q17 is off, the current from the collector of transistor Q15 flows into node OFF and into node L of the transistor-diode bridge. When transistor Q16 is on, current from node M of the transistor-diode bridge flows into node OFF and into the collector of Q16. The current into node L and out of node M causes diodes CR9 and CR10 to be forward biased and conductive, and turns transistors Q9 and Q10 on. Transistors Q7, Q8, Q9, and Q10 and diodes CR9, CR10, CR11, and CR12 act as a bridge and generate an output signal at node OUT having a voltage that equals the voltage at node A. Current for the output signal is supplied by transistors Q13 and Q18 through nodes I+ and I−. The various filter resistors and capacitors act to dampen transients within the buffer and tri-state switch circuit.

When the tri-state driver circuit is to switch to the high impedance output state, input ON is lower in voltage than input VBB. In the preferred embodiment, input VBB is a constant reference voltage and input ON is an ECL signal that is either logic high or logic low. When input ON is lower than input VBB, transistor Q20 turns on and transistor Q19 turns off. This in turn turns transistor Q17 on and transistor Q16 off. The current from the collector of transistor Q14 now flows into node OFF and into node M of the transistor-diode bridge. Correspondingly, current now flows out of node L to node OFF and into the collector of transistor Q17.

The current into node M reverse biases diode CR10, while the current out of node L reverse biases diode CR9. Input VCHI and diode CR7 act to clamp the voltage at the base of transistor Q10 to the voltage of VCHI. This causes diode CR12 to be reverse biased for any voltage applied at node OUT that is less than VCHI. Similarly, input VCLO and diode CR8 act to clamp the voltage at the base of transistor Q9 to the voltage of VCLO. This causes diode CR11 to be reverse biased for any voltage applied at node OUT that is greater than VCLO. Thus, any signal applied to node OUT having a voltage between VCLO and VCHI is shielded from the tri-state driver circuit. preferably, values for VCLO and VCHI are chosen to be just greater than the expected range of signal voltages to improve the response time when the driver circuit is turned back on.

The following table lists the component values and types for the preferred embodiment of this invention.

| Component Values and Types | | | | | |
|---|---|---|---|---|---|
| Type | Value | Type | Value | Type | Value |
| R1 | 5k ohms | R33 | 50 ohms | C1 | 10 pf |
| R2 | 3k | R34 | 43 | C2 | 10 pf |
| R3 | 3k | R35 | 100 | C3 | .01 uf |
| R4 | 500 | R36 | 100 | C4 | 68 pf |
| R5 | 90 | R37 | 100 | C5 | .01 uf |
| R6 | 100 | R38 | 100 | C6 | 68 pf |
| R7 | 120 | R40A & B | 20k | C7 | .001 uf |
| R8 | 30 | R41 | 1k | C8 | .001 uf |
| R9 | 500 | R42 | 50 | C9 | .01 uf |
| R10 | 100 | R43 | 50 | C10 | .1 uf |
| R11 | 100 | R44 | 50 | C11 | .01 uf |
| R13 | 100 | R45 | 50 | C12 | .1 uf |
| R14 | 50 | R46 | 100 | C13 | .01 uf |
| R15 | 100 | R47 | 384 | C14 | .01 uf |
| R16 | 100 | R48 | 192 | C15 | .001 uf |
| R17 | 62 | R49 | 50 | C16 | .001 uf |
| R18 | 10k | R50 | 50 | C17 | 3 pf |
| R19 | 100 | R51 | 50 | C18 | 10 pf |
| R20 | 10k | R52 | 50 | C19 | 10 pf |
| R21 | 50 | R53 | 24k | C20 | .01 uf |
| R22 | 50 | R54 | 50 | C21 | .01 uf |
| R23 | 62 | R55 | 50 | C23 | .001 uf |
| R24A & B | 20k | R56 | 75 | C24 | .001 uf |
| R25 | 24 | R57 | 148 | C25 | .01 uf |
| R26 | 24 | R58 | 75 | C26 | .01 uf |
| R27 | 1k | R59 | 100 | V1 | 14.5 v |
| R28 | 1k | R60 | 1k | V2 | 10.0 v |
| R29 | 2.7 | R61 | 50 | V3 | −7.5 v |
| R30 | 100 | R62 | 50 | V4 | −12.0 v |
| R31 | 2.7 | R63 | 430 | | |
| R32 | 50 | R64 | 10k | | |
| | | R65 | 10k | | |

Although a preferred embodiment of the invention has been shown in the Figures and described above, this embodiment is intended only to illustrate the invention. The full scope of the invention may be ascertained with reference to he following claims.

What is claimed is:

1. A circuit for selectively generating an output signal equal to a selected one of two reference voltages, said circuit comprising:

first and second current source means for respectively supplying first and second currents, wherein said first and second currents are substantially equal;

bridge means, including first and second nodes and coupled to said first current source means at said first node and to said second current source means at said second node, for providing a path for a bridge current to flow between said first and second nodes;

current sink means for receiving said first and second currents and for maintaining the average voltage of said bridge means equal to the average voltage of said two reference voltages;

feedback means coupled to said bridge means and to said first and second current source means for adjusting the magnitude of said first and second currents so as to cause the voltages at said first and said second nodes to equal said two reference voltages;

current switch means coupled to said first and second nodes of said bridge means for selecting the direction of flow of said bridge current across said bridge means, wherein the voltage at said first node equals the selected one of said two reference voltages; and wherein the bridge means further includes:

network means for interconnecting a third node with fourth and fifth nodes and for interconnecting said fourth and fifth nodes with a sixth node;

first and second resistors coupled to said network means with said first resistor connected between said first and said third nodes and said second resistor connected between said second and said sixth nodes, wherein said first and second resistors have substantially equal resistance values;

third current source means coupled to said fourth node for supplying a constant current to said bridge means; and fourth current source means coupled to said fifth node for receiving said constant current from said bridge means.

2. A circuit as recited in claim 1 wherein the network means of the bridge means is a diode bridge that comprises four interconnected diodes with the anodes of two of said diodes being connected in common to the fourth node and the cathodes thereof being respectively connected to the third and sixth nodes, and with the cathodes of the other two of said diodes being connected in common to the fifth node and the anodes thereof being respectively connected to said third and said sixth nodes, and wherein said diodes act to limit the magnitude of the bridge current to a value not greater than the constant current supplied by said third current source means.

3. A circuit as recited in claim 1 wherein the third current source means comprises:

a PNP transistor having a collector coupled to the fourth node;

an operational amplifier having an output coupled to the base of said PNP transistor, having an inverting input coupled to the emitter of said PNP transistor, and having a non-inverting input coupled to a source of a first constant voltage; and a resistor coupled at one end thereof to the common connection between said emitter and said inverting input and coupled at the other end thereof to a source of a second constant voltage, wherein said second constant voltage is greater than said first constant voltage, and wherein the constant current supplied by said third current source means to said fourth node is proportional to the difference between said first and second constant voltages and is inversely proportional to the resistance of said resistor.

4. A circuit as recited in claim 1 wherein the fourth current source means comprises:

an NPN transistor having a collector coupled to the fifth node;

an operational amplifier having an output coupled to the base of said NPN transistor, having an inverting input coupled to the emitter of said NPN transistor, and having a non-inverting input coupled to a source of a third constant voltage; and a resistor coupled at one end thereof to the common connection between said emitter and said inverting input and coupled at the other end thereof to a source of a fourth constant voltage, wherein said third constant voltage is greater than said fourth constant voltage, and wherein the constant current received by said fourth current source means from said fifth node is proportional to the difference between said third and fourth constant voltages and is inversely proportional to the resistance of said resistor.

5. A circuit as recited in claim 1 further comprising:

first buffer means coupled to the fourth node of the bridge means for supplying a voltage at a seventh node equal to the voltage at said fourth node; and second buffer means coupled to the fifth node of said bridge means for supplying a voltage at an eighth node equal to the voltage at said fifth node.

6. A circuit as recited in claim 5 wherein the first buffer means is an operational amplifier having a non-inverting input connected to the fourth node and having an inverting input and an output connected in common and also connected to the seventh node, and wherein said second buffer means is an operational amplifier having a non-inverting input connected to the fifth node and having an inverting input and an output connected in common and also connected to the eighth node.

7. A circuit as recited in claim 5 wherein the current sink means comprises:

fifth current source means coupled to the current switch means for receiving the first and second currents;

a voltage divider coupled to the seventh and eighth nodes for forming an average bridge voltage at a ninth node equal to the average voltage of the fourth and fifth nodes of the bridge means; and a sink controller coupled to said fifth current source means, to said voltage divider, and to the two reference voltages, said sink controller is operable for controlling the current flowing through said fifth current source means so as to cause said average bridge voltage to equal the average of said two reference voltages.

8. A circuit as recited in claim 7 wherein the fifth current source means comprises an NPN transistor having a collector connected to the current switch means through a resistor and having an emitter connected to a negative voltage source through another resistor, wherein the voltage divider comprises two matched resistors one of which is connected between the seventh and ninth nodes and the other of which is connected between the eighth and ninth nodes, and wherein the sink controller comprises an operational amplifier having a non-inverting input connected to said ninth node, an inverting input to which the average of the two reference voltages is applied, and an output coupled to the base of said NPN transistor of said fifth current source means.

9. A circuit as recited in claim 8 wherein the inverting input of the operational amplifier is connected to the common connection between two additional matched resistors, one of said additional matched resistors is connected between said common connection and one of the two reference voltages, and the other of said additional matched resistors is connected between said common connection and the other one of said two reference voltages.

10. A circuit as recited in claim 5 wherein the feedback means comprises:
   a bridge follower coupled to the seventh and eighth nodes for supplying a voltage at a tenth node equal to the higher of the two voltages of the first and second nodes;
   sixth current source means coupled to said bridge follower for providing a feedback current to said bridge follower that is substantially equal to each of the first and second currents supplied to the bridge means by the first and second current source means; and
   a source controller coupled to said tenth node and to said first, second, and sixth current source means for respectively adjusting said first, second, and feedback currents in response to the difference between the voltage at said tenth node and the higher of the two reference voltages.

11. A circuit as recited in claim 10 wherein the network means of the bridge means is a diode bridge that comprises:
   four interconnected diodes with the anodes of two of said four diodes being connected in common to the fourth node and the cathodes thereof being respectively connected to the third and sixth nodes, and with the cathodes of the other two of said four diodes being connected in common to the fifth node and the anodes thereof being respectively connected to said third and said sixth nodes;
   and wherein the bridge follower of the feedback means comprises:
   two interconnected diodes with the anode of one of said two diodes being connected to the seventh node and the cathode thereof being connected to an eleventh node, and with the anode of the other one of said two diodes being connected to said eleventh node and the cathode thereof being connected to the eighth node; and
   a feedback resistor connected between said tenth and eleventh nodes, said feedback resistor having a resistance that substantially equals the resistance of each of the first and second resistors of said diode bridge.

12. A circuit as recited in claim 10 wherein the first, second, and sixth current source means each comprises a PNP transistor having an emitter connected through a resistor to a constant voltage source and having a base connected in common with the source controller, and wherein the transistor of said first current source means has a collector connected to the first node, the transistor of said second current source means has a collector connected to the second node, and the transistor of said sixth current source means has a collector connected to the tenth node.

13. A circuit as recited in claim 12 wherein the source controller comprises an operational amplifier having a non-inverting input connected to the tenth node, an inverting input coupled to the higher of the two reference voltages, and an output coupled in common to the bases of the transistors of the first, second, and sixth current source means.

14. A circuit as recited in claim 1 wherein the current switch means comprises:
   a first current switch transistor having a collector that is connected to the first node and an emitter that is coupled to the current sink means;
   a second current switch transistor having a collector that is connected to the second node and an emitter that is coupled to said current sink means; and
   selection means coupled to the bases of said first and second current switch transistors for controlling the direction of flow of the bridge current across the bridge means by controlling the conductive states of said transistors.

15. A circuit as recited in claim 14 wherein the first current switch transistor conducts substantially all of the total current supplied by the first and second current source means when the lower of the two reference voltages is selected, whereupon the bridge current flows from the second node to the first node, and wherein the second current switch transistor conducts substantially all of said total current when the higher of said two reference voltages is selected, whereupon said bridge current flows from said first node to said second node.

16. A circuit as recited in claim 1 further comprising:
   buffer and tri-state switch means coupled to the first node for generating a buffered output signal at an output node thereof, said buffered output signal being equal in voltage to the voltage of said first node, and for alternatively providing a high impedance output state at said output node; and
   switch controller means coupled to said buffer and tri-state switch means for controlling said buffer and tri-state switch means in selecting between said high impedance output state and said buffered output signal.

17. A circuit as recited in claim 16 wherein said buffer and tri-state switch means is transistor-diode bridge and comprises:
   first and second input transistors operating as emitter followers and having bases thereof commonly connected to the first node, said first input transistor is a PNP transistor with the collector thereof connected to a negative voltage source, said second input transistor is an NPN transistor with the collector thereof connected to a positive voltage source;
   first and second input diodes, said first input diode having a cathode connected to the emitter of said first input transistor and having an anode connected to a twelfth node, said second input diode having an anode connected to the emitter of said second input transistor and having a cathode connected to a thirteenth node;

first and second output transistors operating as emitter followers, said first output transistor is an NPN transistor with the base thereof coupled to said twelfth node and the collector thereof connected to a current source, said second output transistor is a PNP transistor with the base thereof coupled to said thirteenth node and the collector thereof connected to a current sink; and first and second output diodes, said first output diode having an anode coupled to the emitter of said first output transistor and having a cathode coupled to said output node, said second output diode having a cathode coupled to the emitter of said second output transistor and having an anode coupled to said output node.

18. A circuit as recited in claim 17 wherein the switch controller means is operable for selecting between the high impedance output state and the buffered output signal by applying control currents to the twelfth and thirteenth nodes of the buffer and tri-state switch means, wherein control currents into said twelfth node and out of said thirteenth node causes the first and second input and output diodes to be forward biased and causes said buffered output signal to appear at said output node, and wherein control currents into said thirteenth node and out of said twelfth node cause said diodes to be reverse biased and non-conductive and causes said high impedance output state to appear at said output node.

19. A circuit as recited in claim 18 further comprising:
a first clamp diode with the cathode thereof coupled to the twelfth node and with the anode thereof connected to a source of a low clamping voltage; wherein said low clamping voltage is applied to the base of the first output transistor when the high impedance output state is selected; and
a second clamp diode with the anode thereof coupled to the thirteenth node and with the cathode thereof connected to a source of a high clamping voltage, wherein said high clamping voltage is applied to the base of the second output transistor when said high impedance output state is selected.

20. A transistor-diode bridge circuit for alternatively supplying an output signal at an output node or providing a high impedance output state at said output node, wherein said output signal is equal in voltage to an input signal applied at an input node, said circuit comprising:
first and second input transistors operating as emitter followers and having bases thereof commonly connected to said input node, said first input transistor is a PNP transistor with the collector thereof connected to a negative voltage source, said second input transistor is an NPN transistor with the collector thereof connected to a positive voltage source;
first and second input diodes, said first input diode having a cathode connected to the emitter of said first input transistor and having an anode connected to a first node, said second input diode having an anode connected to the emitter of said second input transistor and having a cathode connected to a second node;
first and second output transistors operating as emitter followers, said first output transistor is an NPN transistor with the base thereof coupled to said first node and the collector thereof connected to a current source, said second output transistor is a PNP transistor with the base thereof coupled to said second node and the collector thereof connected to a current sink;

first and second output diodes, said first output diode having an anode coupled to the emitter of said first output transistor and having a cathode coupled to said output node, said second output diode having a cathode coupled to the emitter of said second output transistor and having an anode coupled to said output node;

switch controller means coupled to said first and second nodes for selecting between said high impedance output state and said output signal by applying control currents to said first and second nodes, wherein control currents into said first node and out of said second node causes the first and second input and output diodes to be forward biased and causes said output signal to appear at said output node, and wherein control currents into said second node and out of said first node cause said diodes to be reverse biased and non-conductive and causes said high impedance output state to appear at said output node.

21. A circuit as recited in claim 20 further comprising:
a first clamp diode with the cathode thereof coupled to the first node and with the anode thereof connected to a source of a low clamping voltage; wherein said low clamping voltage is applied to the base of the first output transistor when the high impedance output state is selected; and
a second clamp diode with the anode thereof coupled to the second node and with the cathode thereof connected to a source of a high clamping voltage, wherein said high clamping voltage is applied to the base of the second output transistor when said high impedance output state is selected.

22. A circuit for selectively generating an output signal equal to a selected one of two reference voltages, said circuit comprising:
first and second transistors for respectively supplying substantially equal first and second currents, said first and second transistors having commonly connected bases and each having an emitter that is connected to a constant voltage through a resistor;
a diode bridge comprising four diodes and two resistors, a first resistor of said resistors being connected at one end thereof to the collector of said first transistor at a first node, a second resistor of said resistors being connected at one end thereof to the collector of said second transistor at a second node, a first diode of said diodes having a cathode connected to the other end of said first resistor at a third node and having an anode connected to a fourth node, a second diode of said diodes having an anode connected to said third node and having a cathode connected to a fifth node, a third diode of said diodes having an anode connected to said fourth node and having a cathode connected to the other end of said second resistor at a sixth node, a fourth diode of said diodes having a cathode connected to said fifth node and having an anode connected to said sixth node, said diode bridge providing a path for a bridge current to flow between said first and second nodes;
third and fourth transistors for respectively supplying a constant current to said fourth node and receiving said constant current from said fifth node, said third transistor having a collector connected to said fourth node, said fourth transistor having a collector connected to said fifth node;

fifth and sixth transistors for selecting the direction of flow of said bridge current, said fifth transistor having a collector connected to said first node, said sixth transistor having a collector connected to said second node and having an emitter coupled to the emitter of said fifth transistor;

selection means coupled to the bases of said fifth and sixth transistors for switching said fifth transistor to a less conductive state when the higher of said two reference voltages is selected and for switching said sixth transistor to a less conductive state when the lower of said two reference voltages is selected;

a seventh transistor operable as a sink for current flowing through said fifth and sixth transistors, said seventh transistor having a collector that is coupled to the emitters of said fifth and sixth transistors through a resistor, and having an emitter that is coupled to a negative voltage source;

a first buffer coupled to said fourth node for establishing a voltage at a seventh node that is equal to the voltage at said fourth node;

a second buffer coupled to said fifth node for establishing a voltage at an eighth node that is equal to the voltage at said fifth node;

a voltage divider connected between said seventh and eighth nodes for establishing a voltage at a ninth node that is equal to the average voltage of said seventh and eighth nodes;

a first operational amplifier for controlling the current flow through said seventh transistor such that the average voltage at said fourth and fifth nodes is equal to the average voltage of said two reference voltage, said first operational amplifier having a non-inverting input connected to said ninth node, having an inverting input to which said average voltage of said two reference voltages is applied, and having an output that is coupled to the base of said seventh transistor;

an eighth transistor having a base thereof connected to the commonly connected bases of said first and second transistors, having an emitter thereof coupled to said constant voltage through a resistor, and having a collector thereof coupled to a tenth node, said eighth transistor is operable for outputting a feedback current that is substantially equal to each of said first and second currents;

two diodes interconnected between said seventh and eighth nodes, one of said two diodes having an anode thereof connected to said seventh node and having a cathode thereof connected to an eleventh node, the other of said two diodes having an anode thereof connected to said eleventh node and having a cathode thereof connected to said eighth node;

a third resistor connected at one end thereof to said eleventh node and connected at the other end thereof to said tenth node; and a second operational amplifier having a non-inverting input connected to said tenth node, having an inverting input coupled to the higher of said two reference voltages, and having an output coupled to the bases of said first, second, and eighth transistors, said second operational amplifier is operable for controlling said first, second, and feedback currents such that the higher of the voltages at said first and second nodes is substantially equal to the higher of said two reference voltages.

* * * * *